United States Patent
Hachitani

(10) Patent No.: US 10,338,168 B2
(45) Date of Patent: Jul. 2, 2019

(54) MAGNETIC RESONANCE MEASUREMENT APPARATUS WITH SELECTIVE FREQUENCY CONVERSION OF TRANSMISSION AND/OR RECEPTION SIGNAL

(71) Applicant: JEOL Ltd., Tokyo (JP)

(72) Inventor: Kenichi Hachitani, Tokyo (JP)

(73) Assignee: JEOL Ltd., Tokyo (JP)

( * ) Notice: Subject to any disclaimer, the term of this patent is extended or adjusted under 35 U.S.C. 154(b) by 986 days.

(21) Appl. No.: 14/805,706

(22) Filed: Jul. 22, 2015

(65) Prior Publication Data
US 2016/0187437 A1    Jun. 30, 2016

(30) Foreign Application Priority Data

Jul. 23, 2014 (JP) ................................. 2014-149864

(51) Int. Cl.
G01R 33/36 (2006.01)
G01R 33/54 (2006.01)

(52) U.S. Cl.
CPC ..... G01R 33/3607 (2013.01); G01R 33/3621 (2013.01); G01R 33/543 (2013.01)

(58) Field of Classification Search
USPC .......... 324/300–322; 600/407–435; 382/128–131
See application file for complete search history.

(56) References Cited

U.S. PATENT DOCUMENTS

| 4,677,382 | A  * | 6/1987  | Vatis  | G01R 33/3607 324/307 |
| 4,694,254 | A  * | 9/1987  | Vatis  | G01R 33/3607 324/309 |
| 6,249,360 | B1 * | 6/2001  | Pollard | H04N 1/047 358/473 |
| 7,173,427 | B1 * | 2/2007  | Adachi | G01R 33/3621 324/318 |
| 2008/0227394 | A1 * | 9/2008  | Homan | A61B 1/00016 455/41.3 |
| 2008/0284470 | A1 | 11/2008 | Park et al. | |
| 2012/0310055 | A1 * | 12/2012 | Jean  | A61B 5/0507 600/310 |

FOREIGN PATENT DOCUMENTS

| JP | 698874 A    | 4/1994 |
| JP | 200617486 A | 1/2006 |
| JP | 2008286635 A | 11/2008 |
| JP | 201025896 A | 2/2010 |
| JP | 2010139316 A | 6/2010 |

* cited by examiner

Primary Examiner — Tung X Nguyen
Assistant Examiner — Robert P Alejnikov, Jr.
(74) Attorney, Agent, or Firm — The Webb Law Firm

(57) ABSTRACT

In a magnetic resonance measurement apparatus, when a frequency of an observation nucleus falls within a high frequency band, a frequency conversion scheme is selected. In this case, an intermediate frequency signal is generated as an original signal, which is then frequency-converted to generate an RF transmission signal. An RF reception signal is converted into an intermediate frequency signal by frequency conversion, and is sampled. When the frequency of the observation nucleus falls within a low frequency band, a non-conversion scheme is selected. In this case, an RF transmission signal is generated as the original signal, and an RF reception signal is sampled.

9 Claims, 10 Drawing Sheets

| | 110 | 112 | 114 | 116 | 118 |
|---|---|---|---|---|---|
| | RF | ORIGINAL SIGNAL/SAMPLING TARGET | TRANSMISSION SIDE ROUTE SELECTION | RECEPTION SIDE ROUTE SELECTION | SAMPLING SCHEME |
| 120 | GREATER THAN OR EQUAL TO 5 MHz AND LESS THAN 50 MHz | RF SIGNAL (GREATER THAN OR EQUAL TO 5 MHz AND LESS THAN 50 MHz) | MIXER BYPASS | MIXER BYPASS | OVER-SAMPLING (100 MHz) |
| 122 | GREATER THAN OR EQUAL TO 50 MHz AND LESS THAN OR EQUAL TO 1000 MHz | IF SIGNAL (125 MHz FOR OBSERVATION NUCLEUS) | MIXER PASS | MIXER PASS | UNDER-SAMPLING (100 MHz) |

| 110 | 112 | 114 | 116 | 118 |
|---|---|---|---|---|
| RF | ORIGINAL SIGNAL/SAMPLING TARGET | TRANSMISSION SIDE ROUTE SELECTION | RECEPTION SIDE ROUTE SELECTION | SAMPLING SCHEME |
| 120 — GREATER THAN OR EQUAL TO 5 MHz AND LESS THAN 50 MHz | RF SIGNAL (GREATER THAN OR EQUAL TO 5 MHz AND LESS THAN 50 MHz) | MIXER BYPASS | MIXER BYPASS | OVER-SAMPLING (100 MHz) |
| 122 — GREATER THAN OR EQUAL TO 50 MHz AND LESS THAN OR EQUAL TO 1000 MHz | IF SIGNAL (125 MHz FOR OBSERVATION NUCLEUS) | MIXER PASS | MIXER PASS | UNDER-SAMPLING (100 MHz) |

FIG. 4

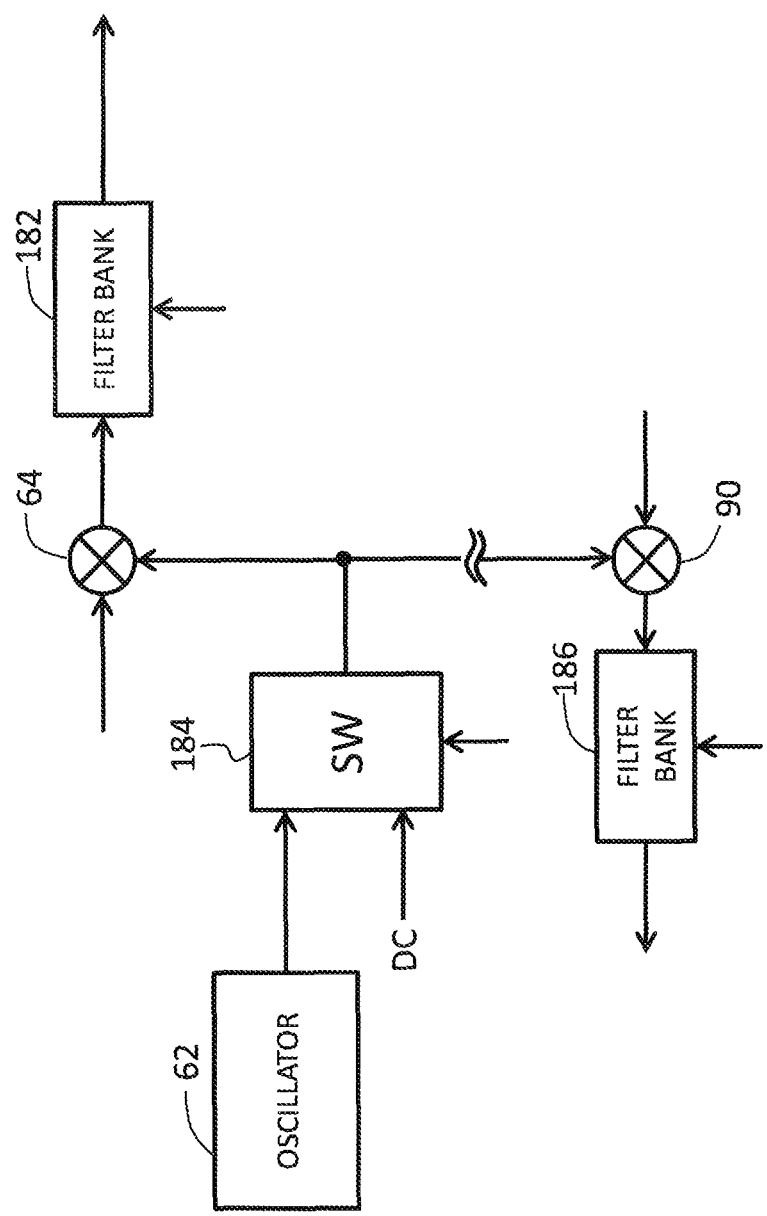

MAGNETIC RESONANCE MEASUREMENT APPARATUS WITH SELECTIVE FREQUENCY CONVERSION OF TRANSMISSION AND/OR RECEPTION SIGNAL

CROSS REFERENCE TO RELATED APPLICATIONS

This application claims priority to Japanese Patent Application No. 2014-149864 filed on Jul. 23, 2014, which is incorporated herein by reference in its entirety.

BACKGROUND OF THE INVENTION

Field of the Invention

The present invention relates to a magnetic resonance measurement apparatus, and in particular to processing of a transmission signal and a reception signal.

Related Art

As magnetic resonance measurement apparatuses, nuclear magnetic resonance (NMR) measurement apparatuses and electron spin resonance (ESR) measurement apparatuses are known. In addition, as apparatuses classified as NMR measurement apparatuses, magnetic resonance imaging (MRI) apparatuses are also known. In the following, NMR measurement apparatuses will be described.

NMR refers to a phenomenon where an atomic nucleus under a static magnetic field interacts with an electromagnetic wave having a frequency intrinsic to the atomic nucleus. An apparatus that executes measurement of a sample at an atomic level taking advantage of this phenomenon is an NMR measurement apparatus. Currently, NMR measurement apparatuses are used in analyses of organic compounds (for example, medicines and agricultural chemicals), polymer materials (for example, vinyl and polyethylene), biological substances (for example, nucleic acids and proteins), or the like. With the use of an NMR measurement apparatus, for example, a molecular structure of the sample can be revealed.

An NMR measurement apparatus generally includes a control computer, a radio frequency (RF) signal transmitter, an NMR signal detector (probe), a static magnetic field generator (superconductive magnet), an NMR signal receiver, and the like. In some cases, a part of these structures is called an NMR measurement apparatus. For example, a part of a spectrometer including the control computer, the RF signal transmitter, and the NMR signal receiver may be called an NMR measurement apparatus. In a typical NMR measurement, a high-frequency signal for NMR measurement (RF transmission signal) is generated in the transmitter, and the transmission signal is supplied to a transmission and reception coil in the probe. A resonance absorption phenomenon is caused in an observation nucleus in the sample due to an electromagnetic wave caused by the transmission signal. An NMR signal induced in the transmission and reception coil (RF reception signal) is then transmitted to the receiver, and a spectrum of the received signal is analyzed.

In the NMR measurement, transmission signals (RF signals) having various frequencies must be generated according to the observation nucleus and other conditions. In addition, a precise and high-speed signal control must be executed with a high level of stability. Thus, in a typical NMR measurement apparatus, a local signal is mixed with an intermediate frequency signal (IF transmission signal), to generate the RF transmission signal. In addition, the same local signal is mixed with the RF reception signal to generate the intermediate frequency signal (IF reception signal) (superheterodyne method) (refer to JP 2010-139316 A). The IF reception signal is converted into an audio frequency signal (or a baseband signal) by, for example, a quadrature detection process, and a filter process and an FFT process are executed on the converted signal.

However, in the NMR measurement, in general, a reduction of purity of the signal (for example, increase of a phase noise, mixture of unnecessary signal and noise) becomes problematic in the RF transmission signal and the RF reception signal. Thus, sometimes it may be desirable to not frequently manipulate or process the RF transmission signal and the RF reception signal. In particular, when the intrinsic frequency of the NMR is low, in principle, sensitivity and precision of the NMR signal are more easily lost, and the problem of the signal purity may become significant. Further, the signal purity may become problematic due to other reasons.

SUMMARY OF THE INVENTION

An advantage of the present invention is that, in a magnetic resonance measurement apparatus, there is realized signal processing which is suitable for both a situation where maintenance of the signal purity must be prioritized and a situation where other circumstances must be prioritized. Another advantage of the present invention is that suitable signal processing can be executed according to the frequency of the observation nucleus. Yet another advantage of the present invention is that a transmission signal generation scheme (plan or program) and a reception signal processing scheme can be changed according to the circumstances.

According to one aspect of the present invention, there is provided a magnetic resonance measurement apparatus comprising: a transmission signal generator that generates an RF transmission signal; and a reception signal processor that processes an RF reception signal, wherein at least one of the transmission signal generator and the reception signal processor has a function to selectively apply a frequency conversion scheme and a non-conversion scheme. Here, the frequency conversion scheme refers to a scheme where a conversion process from or to an intermediate frequency is executed during the signal processing, and the non-conversion scheme refers to a scheme where the conversion process is not executed during the signal processing.

According to the above-described configuration, at least one of the transmission signal generator and the reception signal processor corresponds to both the frequency conversion scheme and the non-conversion scheme, and a suitable scheme may be selected according to the circumstances. For example, when maintenance of the signal purity is to be prioritized, the non-conversion scheme may be employed, and the conversion scheme may be employed in the other cases. According to this aspect of the present invention, a problem due to a uniform or fixed process can be improved. The conversion process from the intermediate frequency (IF) is a process to convert the intermediate frequency to a frequency of the RF transmission signal. The conversion process to the intermediate frequency is a process to convert the frequency of the RF reception signal (desirably, the NMR signal) to the intermediate frequency. The latter process differs from a process to convert from the intermediate frequency to the baseband, and such a final conversion process may be applied as necessary in the reception signal process in any scheme.

According to another aspect of the present invention, preferably, the magnetic resonance measurement apparatus further comprises a controller that selects the frequency conversion scheme and the non-conversion scheme, wherein both the transmission signal generator and the reception signal processor operate according to the frequency conversion scheme when the controller selects the frequency conversion scheme, and both the transmission signal generator and the reception signal processor operate according to the non-conversion scheme when the controller selects the non-conversion scheme. According to such a configuration, because the same scheme is always applied in the transmission signal generation and the reception signal processing, problems that may be caused when different schemes are applied between the transmission signal generation and the reception signal processing can be avoided. In other words, synchronism between the transmission signal and the reception signal can be maintained.

According to another aspect of the present invention, preferably, the controller selects the frequency conversion scheme or the non-conversion scheme according to an observation nucleus. Alternatively, selection based on other conditions or selection by the user may be considered. According to another aspect of the present invention, preferably, the controller selects the frequency conversion scheme when a frequency corresponding to the observation nucleus falls within a high frequency band in which the signal cannot be directly handled in an IF signal generator or an IF signal processor, and selects the non-conversion scheme when the frequency corresponding to the observation nucleus falls within a low frequency band which is lower than the high frequency band. The above-described configuration takes into consideration that, in general, it may be difficult to realize a circuit which directly generates a signal of a high frequency or a circuit which can receive a signal of a high frequency, and that the signal purity may be particularly problematic when the frequency is low. If the non-conversion scheme is applied for all frequency bands, all of many numbers of circuits must be set to correspond to a wide band, but if the non-conversion scheme is to be applied only for the low frequency band, such a problem can be avoided or reduced. When the frequency conversion scheme is applied in all frequency bands, the frequency conversion would be uniformly applied even for a signal of the low frequency band which can be directly handled in the circuit, in which case the purity of the signal would be reduced. On the other hand, according to the above-described configuration, because the conversion scheme is applied only for the high frequency band, the problem of reduction of purity can be avoided or reduced.

According to another aspect of the present invention, preferably, the transmission signal generator comprises: an original signal generator circuit that generates an IF (intermediate frequency) transmission signal when the frequency conversion scheme is selected and generates the RF transmission signal when the non-conversion scheme is selected; and a transmission side frequency converter circuit that converts the IF transmission signal into the RF transmission signal when the frequency conversion scheme is selected. According to another aspect of the present invention, preferably, the transmission side frequency converter circuit comprises: a frequency conversion route having a frequency conversion mixer; a bypass route provided in parallel with the frequency conversion route; and a selection circuit that selects the frequency conversion route and the bypass route. According to such a configuration, the presence or absence of the frequency conversion can be switched by routing of the routes. For this purpose, some processor circuit may be provided on the bypass route, but if no processor circuit is provided, the purity of the signal can be maintained.

According to another aspect of the present invention, preferably, the reception signal processor comprises: a reception side frequency converter circuit that converts the RF reception signal into an IF reception signal when the frequency conversion scheme is selected; and a sampling circuit that samples the IF reception signal when the frequency conversion scheme is selected, and samples the RF reception signal when the non-conversion scheme is selected. According to another aspect of the present invention, preferably, the reception side frequency converter circuit comprises: a frequency conversion route having a frequency conversion mixer; a bypass route provided in parallel with the frequency conversion route; and a selection circuit that selects the frequency conversion route and the bypass route.

According to another aspect of the present invention, preferably, at least one of the transmission signal generator and the reception signal processor comprises a mixer that executes a frequency conversion operation in the frequency conversion scheme and executes a non-conversion operation in the non-conversion scheme, and a signal passes through the mixer in either scheme of the frequency conversion scheme and the non-conversion scheme. According to this configuration, the routing of the routes at the switching of the schemes becomes unnecessary, and an advantage can be obtained in that the selection circuit may be omitted. For example, in order to operate the mixer at the non-conversion scheme, the local signal to be input to the mixer may be set as a DC signal (corresponding to a signal of 0 Hz).

BRIEF DESCRIPTION OF THE DRAWINGS

FIG. 4 is a diagram for explaining change of an operation condition according to a frequency of an observation nucleus.

FIG. 15 shows a fifth example configuration of a transmission side frequency converter circuit and a reception side frequency converter circuit.

DESCRIPTION OF THE INVENTION

A preferred embodiment of the present invention will now be described with reference to the drawings.

(1) NMR Measurement Apparatus

Figure 1:
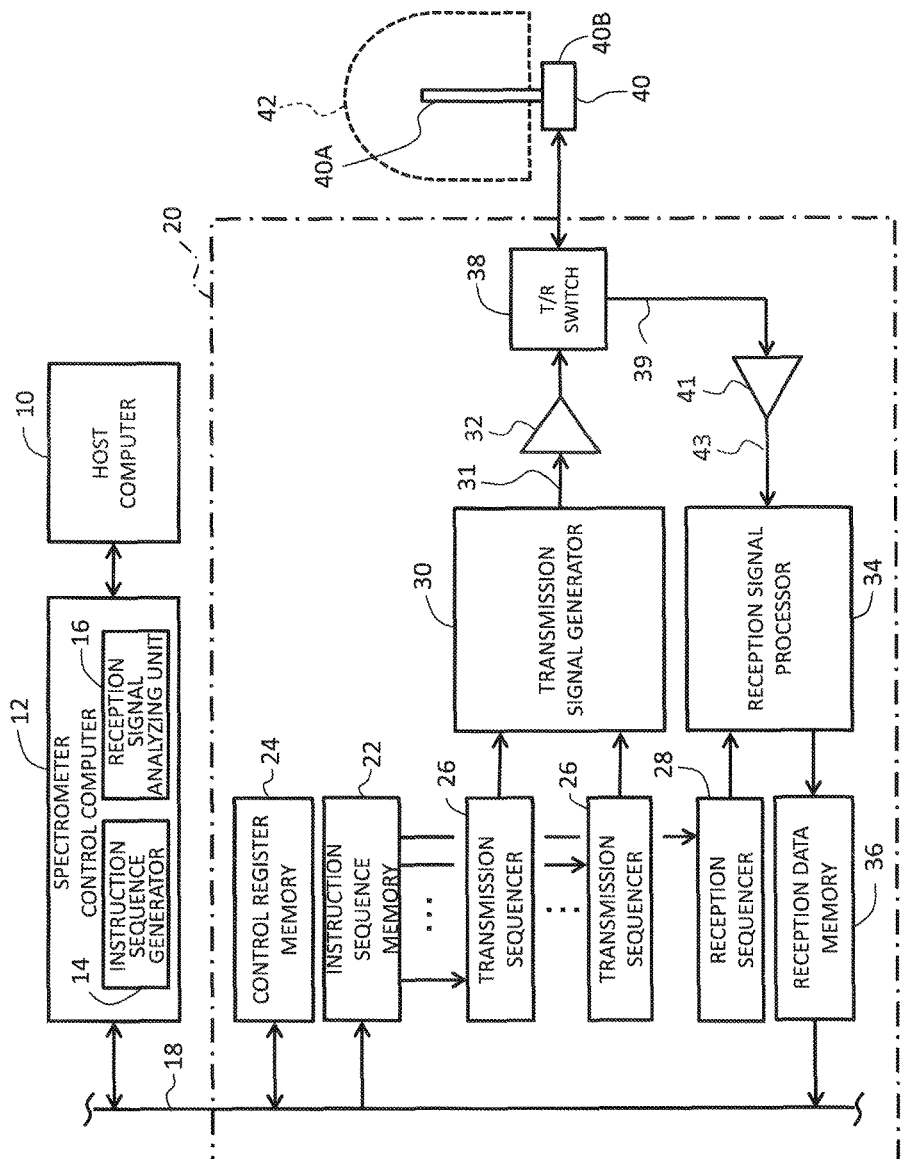
FIG. 1 is a block diagram showing an NMR measurement apparatus according to a preferred embodiment of the present invention.

FIG. 1 shows a preferred embodiment of an NMR measurement apparatus according to the present invention. The NMR measurement apparatus is used for analysis of organic compounds, polymer materials, biological substances, and other substances. A sample to be measured is liquid, solid, or the like. The present invention also can be applied to other magnetic resonance measurement apparatuses.

In FIG. 1, a host computer 10 generates a pulse program. The pulse program is a program describing a pulse sequence for realizing a desired NMR measurement, and is generated by a user or automatically. The pulse program is sent from the host computer 10 to a spectrometer control computer 12. The host computer 10 may be formed by a typical personal computer.

The spectrometer control computer 12 controls an operation of a transmission and reception unit 20 which will be described in detail later, and analyzes reception data obtained from the transmission and reception unit 20. The spectrometer control computer 12 and the transmission and reception unit 20 form a spectrometer. In the present embodiment, the spectrometer control computer 12 is equipped with an instruction sequence generator 14 that converts the pulse program into a sequence of instructions (instruction sequence). The instruction sequence generator 14 is formed, for example, as a compiler. In the present embodiment, the instruction sequence generator 14 generates a sequence of instructions for controlling the transmission and reception unit 20, and the sequence of instructions is sent to the transmission and reception unit 20. Alternatively, the pulse program may be sent to the transmission and reception unit 20 and the transmission and reception unit 20 may interpret the pulse program to generate the instruction sequence. Alternatively, the spectrometer control computer 12 may generate a compressed, intermediate instruction sequence and transfer the instruction sequence to the transmission and reception unit 20, and the transmission and reception unit 20 may decompress the intermediate instruction sequence, to re-construct an uncompressed instruction sequence. In particular, when a transfer rate (amount of data) during transfer is problematic, the transfer of the compressed intermediate instruction sequence as described above is desirable.

The spectrometer control computer 12 is connected to the transmission and reception unit 20 via a communication bus 18. In the example configuration shown in the drawings, the spectrometer control computer 12 is connected to the host computer 10 via a network. The spectrometer control computer 12 is formed, for example, by a dedicated or general-purpose computer. In the present embodiment, the spectrometer control computer 12 is equipped with an FFT calculation function for analyzing the spectrum of the reception signal. This function is shown in FIG. 1 as a reception signal analyzing unit 16. The spectrometer control computer 12 is equipped with, in addition to the spectrum analyzing function, a control function and an administrative function necessary for the NMR measurement. Alternatively, the host computer 10 and the spectrometer control computer 12 may be integrated. Alternatively, a plurality of the spectrometer control computers 12 may be employed. Further alternatively, a part or all of the functions of the spectrometer control computer 12 described above may be equipped in the host computer 10.

The transmission and reception unit 20 will now be described. The transmission and reception unit 20 generates a transmission signal which is necessary for the NMR measurement, and processes a reception signal which represents a result of the NMR measurement. Alternatively, the transmission and reception unit 20, or a part in which the transmission and reception unit 20 and the spectrometer control computer 12 are combined (spectrometer), may be called the NMR measurement apparatus.

An instruction sequence memory 22 stores, in the present embodiment, the sequence of instructions sent from the spectrometer control computer 12. For example, when the sequence of instructions is converted to the intermediate instruction sequence described above, a calculation processor (not shown) generates (re-constructs) the final instruction sequence from the intermediate instruction sequence. Alternatively, the sequence of instructions may be generated by another circuit. On the instruction sequence memory 22, a plurality of storage areas which store the sequence of instructions in units of sequencers to be described below are provided. Alternatively, the storage areas may be provided inside each sequencer. The sequence of instructions includes various instructions, including a dynamic setting parameter to be given to individual dynamic circuit (for example, a suppression level which is set for the dynamic variable attenuator to be described later).

In the present embodiment, in addition to the instruction sequence memory 22, a control register memory 24 is provided. On the control register memory 24, a register area is set, and a static setting parameter to be given to an individual static circuit is written in the register area. Similar to the sequence of instructions, the setting parameter is generated based on the pulse program. The writing of the static setting parameter to the register area is executed by the spectrometer control computer 12. For example, a controller (not shown) may read each static setting parameter from the register area and set the same in each static circuit. Alternatively, an individual static circuit may acquire the static setting parameter from the register area on its own.

In the present disclosure, "static" generally means that an operation condition of the circuit (static circuit) is determined before start of execution of the measurement, and "dynamic" generally means that the operation condition of the circuit (dynamic circuit) is determined during the measurement (that is, the operation condition is changed). In other words, for the static circuit, a necessary setting parameter is given before the start of the measurement, and the setting parameter is maintained during the measurement. For the dynamic circuit, a control is applied to update the setting parameter at a necessary timing during the measurement. With such a configuration, the operation condition of the dynamic circuit is dynamically varied.

A plurality of transmission sequencers 26 control the operations of the plurality of transmission signal generators or the like of a transmission signal generator (transmitter) 30. More specifically, each individual transmission sequencer 26 sequentially executes the sequence of instructions prepared for the transmission sequencer 26 from the beginning. In the present embodiment, four transmission signal generators (four signal generators (FIG. 2)) are provided, and, correspondingly, four transmission sequencers 26 are provided. Specifically, a first transmission sequencer controls a first signal generator, a second transmission sequencer controls a second signal generator, a third transmission sequencer controls a third signal generator, and a fourth transmission sequencer controls a fourth signal generator. However, the one-to-one correspondence relationship is not a requirement, and alternatively, one transmission sequencer may control a plurality of signal generators or a plurality of transmission sequencers may control one signal generator. The control of the operations of a circuit that combines the plurality of the transmission signals (a combiner shown in FIG. 2 and described later) and operations of circuits provided downstream thereof (circuits downstream of the combiner shown in FIG. 2 and described later) is executed by a part or all of the four transmission sequencers. So long as each dynamic circuit can execute a suitable operation at a suitable timing according to the sequence of instructions generated from the pulse program, various structures may be employed for the sequencer or the local controller. The numerical values explicitly described in the present disclosure are given only as exemplary values.

A reception sequencer 28 basically has the same structure as an individual transmission sequencer 26, and sequentially executes the sequence of instructions prepared for the reception sequencer 28 from the beginning. With such a configuration, the operation of each dynamic circuit of a reception signal processor (receiver) 34 is controlled. According to the present embodiment, the reception circuit can also be controlled dynamically. For example, as will be described later, a frequency modulation and a phase modulation can be applied to a pair of reference signals used in quadrature detection, and, moreover, the modulation conditions can be dynamically changed during the measurement. In the present embodiment, only a single reception sequencer 28 is exemplified, but alternatively, the reception signal processor 34 may be controlled by a plurality of reception sequencers. Alternatively, a sequencer which integrally manages the control timings or the like of one or more transmission sequencers and one or more reception sequencers may be provided separately.

The transmission signal generator 30 includes a plurality of signal generators serving as the plurality of transmission signal generators, an adder serving as the combiner, a D/A converter (DAC), a signal processor circuit, a frequency converter circuit, or the like. A specific example structure thereof will be described later with reference to FIG. 2. The transmission signal generator 30 generates an RF transmission signal 31 for NMR measurement. The RF transmission signal 31 is an analog signal, and is transmitted to a power amplifier 32 that executes amplification. The RF transmission signal amplified by the power amplifier 32 is transmitted to a probe 40 via a T/R switch (transmission and reception switch) 38.

The probe 40 includes an insertion section 40A having a transmission and reception coil (not shown), and a housing section 40B corresponding to a root portion of the insertion section 40A. In the example configuration shown in the drawings, the probe has one port, and thus one RF transmission signal is input to the probe. Alternatively, a probe having two or more ports may be used. The insertion section 40A has a cylindrical shape, and is inserted into a bore (cylindrical cavity) of a static magnetic field generator 42. When the RF transmission signal is supplied to the transmission and reception coil, an electromagnetic wave generated in the coil is irradiated onto the sample, and a resonance absorption phenomenon occurs at the observation nucleus of the sample. Then, the NMR signal induced in the transmission and reception coil (RF reception signal) is transmitted from the probe 40 to the reception signal processor 34 via the T/R switch 38.

In the present embodiment, the T/R switch 38 has a routing function to transmit the RF transmission signal to the probe during the transmission and to transmit the RF reception signal from the probe to the reception signal processor 34 during reception. A reception signal 39 from the T/R switch 38 is amplified by a pre-amplifier 41, and an amplified reception signal 43 is transmitted to the reception signal processor 34. Alternatively, the pre-amplifier 41 may be built in the T/R switch 38.

The reception signal processor 34 in the transmission and reception unit 20 is a circuit which executes processes such as the frequency conversion, the A/D (analog-to-digital) conversion, the quadrature detection, or the like on the input RF reception signal. A specific example structure will be described later with reference to FIG. 3. The processed reception signal (complex signal) is temporarily stored in reception data memory 36 as reception data. The reception data which is read from the reception data memory 36 is transmitted to the spectrometer control computer 12, and the analysis of the reception data is executed therein. Alternatively, the reception data may be analyzed in the transmission and reception unit 20.

(2) Transmission Signal Generator

Figure 2:
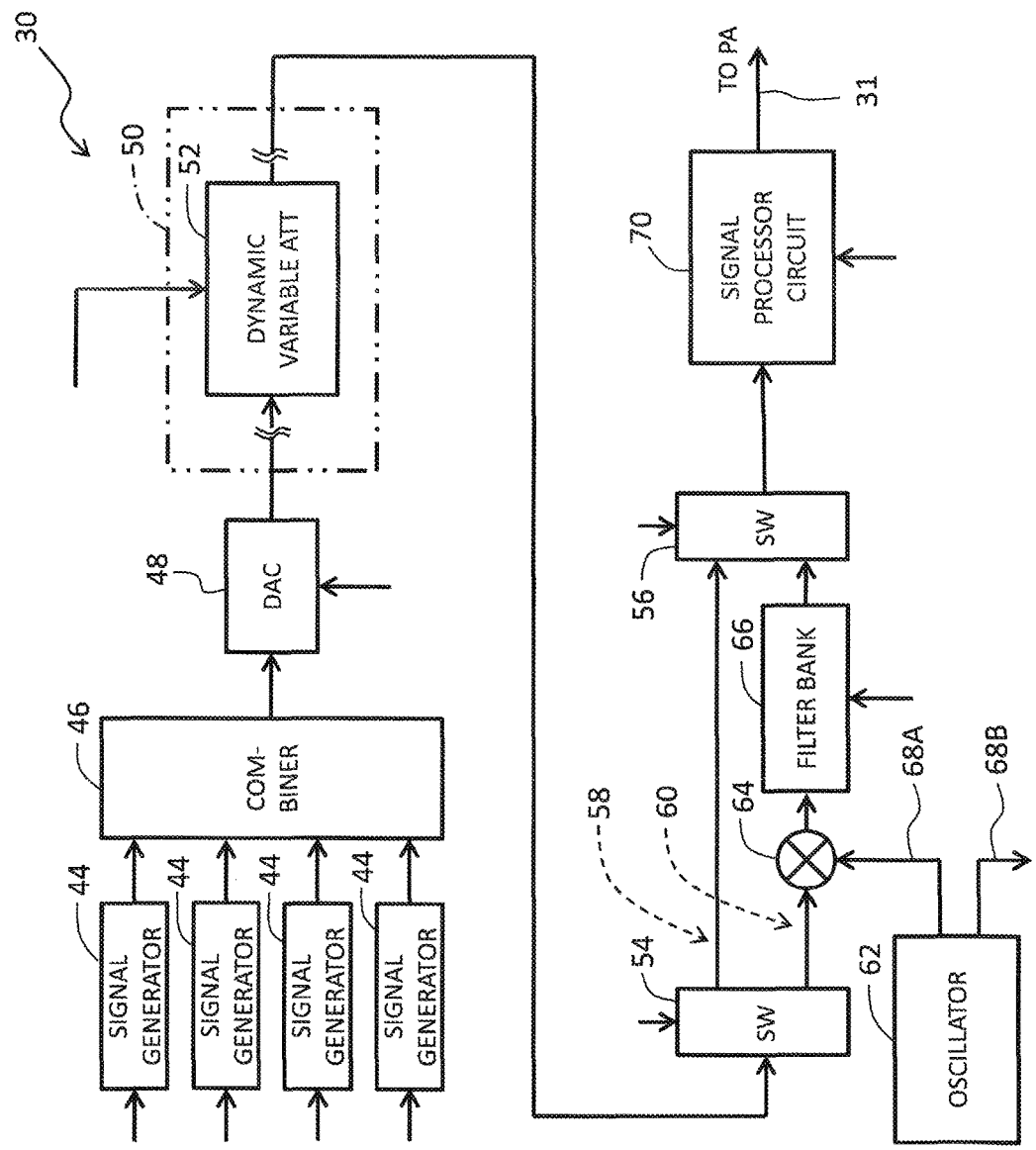
FIG. 2 is a block diagram showing an example structure of a transmission signal generator.

Next, a specific example structure of the transmission signal generator 30 will be described with reference to FIG. 2. In FIG. 2, four signal generators 44 generate a maximum of four transmission signals. The operations of four signal generators 44 are basically controlled by four transmission sequencers. Specifically, a parameter set which defines the operation of each signal generator 44 is provided from each transmission sequencer to each signal generator 44. In the present embodiment, each signal generator 44 includes an NCO (Numerical Controlled Oscillator) with a digital output. The NCO includes a phase accumulator, a sine wave lookup table, or the like. Using the NCO, the frequency modulation, the phase modulation, and the amplitude modulation can be executed. In other words, in each signal generator 44, a transmission signal (original signal) to which the modulation process or the like is applied is generated independently from each other. The frequency of the signal generated in the NCO can be freely determined.

In the present embodiment, the frequency of the transmission signal generated by the signal generator 44 can be arbitrarily selected from, for example, a range of 5-200 MHz. As will be described below, when the frequency of the observation nucleus (frequency of the RF signal) falls within a low frequency band of; for example, greater than or equal to 5 MHz and less than 50 MHz, the frequency of the generated transmission signal (original frequency) is set as the frequency of the RF transmission signal. On the other hand, when the frequency of the observation nucleus falls within a high frequency band of; for example, greater than or equal to 50 MHz and less than or equal to 1000 MHz, a frequency of 125 MHz, for example, is selected as the frequency of the generated transmission signal (original frequency), and is set as an intermediate frequency. The final RF transmission signal is then generated by a frequency conversion with respect to the intermediate frequency signal.

A combiner 46 is a circuit which combines (for example, adds) the plurality of transmission signals (digital signals) generated by the plurality of signal generators 44, to generate a digital combined signal. There is a case where, in reality, only one transmission signal is generated in a group of signal generators, but in many cases, a plurality of transmission signals are generated. For the purpose of this disclosure, an output signal of the combiner 46 will be described as a digital combined signal. The digital combined signal is transmitted to a DAC (D/A converter) 48. A sampling clock of; for example, 800 MHz, is input to the DAC 48, and the digital combined signal is converted into an analog combined signal in the DAC 48. A filter, an amplifier, and other circuits provided downstream of the DAC 48 are omitted in the drawings.

A signal processor circuit 50 is provided downstream of the DAC 48, and includes a dynamic variable ATT (attenuator) 52. The dynamic variable ATT 52 is dynamically controlled by any of the sequencers during the measurement. Specifically, by the action of the dynamic variable ATT 52, the suppression level for the pulse train can be dynamically varied during the measurement. For example, when the analog combined signal which is input to the dynamic variable ATT 52 includes a rectangular pulse of a large amplitude (hard pulse) and a subsequent mountain-shaped pulse of a large amplitude (soft pulse), if the suppression level is set large immediately after the preceding rectangular pulse; for example, if the suppression level is changed from 0 dB to −60 dB, the overall amplitude of the succeeding mountain-shaped pulse can be suppressed while maintaining the amplitude and the waveform of the preceding rectangular pulse. With such a configuration, for example, a pulse sequence as designed, in which a difference in level (difference in amplitude intensity) is provided between the rectangular pulse and the shaped pulse can be realized afterwards. The step of the suppression level of the dynamic variable ATT 52 is, for example, 1 dB.

The dynamic variable ATT 52 is made of; for example, a plurality of AT elements, and one or more ATT elements are selected from the plurality of ATT elements or a combination thereof is selected, to realize a desired suppression level. While it is desirable to employ a structure that can realize suppression levels of multiple stages, it is also possible to use a dynamic variable AT having suppression levels of two stages. Alternatively, an apparatus in which the suppression level can be continuously varied may be used as the dynamic variable ATT. In either case, it is desirable to employ an apparatus having a superior responsiveness. In this process, the supply timing of the control signal to the dynamic variable ATT 52 may be adjusted in anticipation of the delay of the response.

In the present embodiment, the suppression level at the dynamic variable ATT 52 can be dynamically varied in units of individual pulse forming the analog combined signal, for example, in units of the transmission signals from the signal generators 44. Alternatively, a configuration may be employed in which the suppression level can be stepwise or continuously varied within one pulse period included in the analog combined signal. Alternatively, the dynamic variation of the suppression level may be applied to the pulse train which is output from one signal generator 44.

In the present embodiment, the dynamic variable ATT 52 is provided upstream of a frequency converter circuit to be described later (in particular, a mixer 64). With such a configuration, compared to a structure where the dynamic variable ATT 52 is provided downstream of the frequency converter circuit, the influence due to the frequency characteristic of the dynamic variable ATT 52 (in particular, phase shift) can be inhibited. Specifically, at the downstream of the frequency converter circuit, a variation range of the frequency of the RF transmission signal is very wide (in the present embodiment, greater than or equal to 50 MHz and less than or equal to 1000 MHz), and, if the dynamic variable ATT is provided there, the influence by the frequency characteristic of the dynamic variable ATT cannot be ignored, and the phase shift would be great or the phase would change in a complex manner during the dynamic change of the suppression level, for which correction is very difficult. On the other hand, when the dynamic variable ATT is provided upstream of the frequency converter circuit, the frequency of the IF signal passing therethrough is fixed (in the present embodiment, 125 MHz) or the frequency change width of the RF signal passing therethrough is relatively small (in the present embodiment, greater than or equal to 5 MHz and less than 50 MHz), and, consequently, even if there is an influence due to the frequency characteristic as described above, the influence would be relatively small and can be easily corrected.

A frequency converter circuit with a bypass route is provided downstream of the signal processor circuit 50. The frequency converter circuit specifically includes an input side SW (switch) 54, an output side SW 56, and a frequency conversion route 60 and a bypass route 58 provided between the SWs, or the like. On the frequency conversion route 60, the mixer 64 and a filter bank 66 are provided. In the mixer 64, a local signal 68A from an oscillator 62 is mixed into the analog combined signal which is input (in this case, an intermediate frequency signal), and an RF transmission signal is thus generated. In reality, an unnecessary frequency component caused in the mixing (for example, a mixer image corresponding to a sum frequency or a difference frequency) is removed by the filter bank 66, and the RF transmission signal is thus generated. The filter bank 66 includes, for example, a plurality of LPFs (low pass filters) or HPFs (high pass filters) that are provided in parallel to each other, and the LPF or HPF to be actually used is selected therefrom. A cutoff frequency of the filter is statically changed according to the RF frequency. Alternatively, in place of the LPF or the HPF, other filters such as a BPF (band pass filter) may be provided.

In the present embodiment, when the frequency of the observation nucleus falls within the low frequency band, a direct generation scheme; that is, a non-conversion scheme is selected, and, in this case, the input side SW 54 and the output side SW 56 select the bypass route 58. In other words, in this case, the mixer 64 and the filter bank 66 do not function. In this case, the analog combined signal which is the input signal of the frequency converter circuit is not the intermediate frequency signal, and is the RF transmission signal. That is, when the direct generation scheme is selected, the RF transmission signal is generated from the beginning at the plurality of signal generators 44.

On the other hand, when the frequency of the observation nucleus falls within the high frequency band, a frequency conversion scheme is selected, and in this case, the input side SW 54 and the output side SW 56 select the frequency conversion route 60. In other words, in this case, the mixer 64 and the filter bank 66 function. In this case, the analog combined signal, which is the input signal of the frequency converter circuit serves as the intermediate frequency signal, is mixed with the local signal 68A in the mixer 64, then passes through the filter bank 66, and becomes the RF transmission signal. In the above-described example configuration, the ranges for the low frequency band and the high frequency band can be suitably determined. The input side SW 54 and the output side SW 56 are static circuits, and the operations thereof are set before the start of the measurement. Alternatively, the SWs may be constructed as dynamic circuits, and the scheme may be switched during the measurement.

The oscillator 62 is a signal generator which generates the local signal 68A to be supplied to the mixer 64. A frequency of the local signal 68A is determined as a frequency necessary for the frequency conversion from the IF to the RF. The local signal generated in the oscillator 62 is also transmitted to the reception signal processor. This signal is shown with reference numeral 68B. By using the same signal, a transmission processing condition and a reception processing condition can be matched. In this case, it is desirable to match the signal route lengths.

A signal processor circuit 70 is a circuit provided downstream of the frequency converter circuit. The signal processor circuit 70 includes a static fixed ATT and a static variable ATT which can be operated as necessary. An attenuation value of the static fixed ATT is fixed. The attenuation value of the static variable ATT can be varied and set in intervals of predetermined units. The ATTs are static circuits, and the presence/absence of the operation (and the operation condition of the static ATT) is set prior to the start of the measurement. Because the static fixed ATT and the static variable ATT are circuits that are statically set, the phase shift or the like can be identified in advance. In addition, the phase shift or the like can be corrected in advance or afterwards. In the present embodiment, because the static fixed ATT and the static variable ATT are provided downstream of the frequency converter circuit; that is, at the final stage of the transmission signal generator, advantages can be obtained that, due to the suppression actions of the ATTs, the transmission signal which follows the pulse sequence can be generated and that the unnecessary signal generated in the generation process of the transmission signal or mixed noise can be suppressed.

The RF transmission signal 31 is generated by the transmission signal generator 30 in a manner as described above. The RF transmission signal 31 is amplified by the power amplifier 32 shown in FIG. 1, and the amplified RF transmission signal is output to the probe 42 via the T/R switch 38.

(3) Reception Signal Processor

Figure 3:
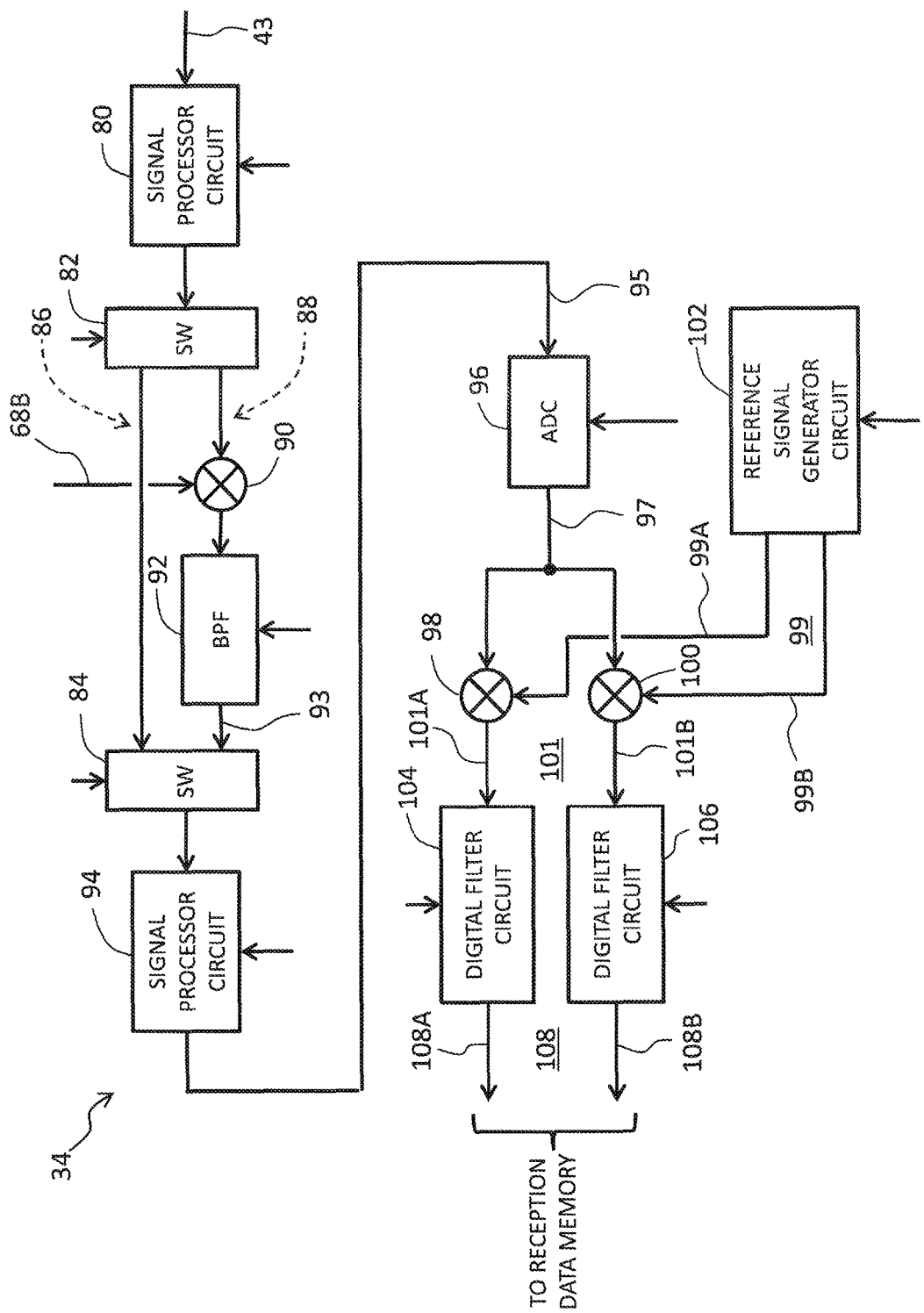
FIG. 3 is a block diagram showing an example structure of a reception signal processor.

Next, a specific example structure of the reception signal processor 34 will be described with reference to FIG. 3. The RF reception signal 43 amplified by the pre-amplifier 41 (FIG. 1) passes through a signal processor circuit 80 and is input to a frequency converter circuit with a bypass route. The signal processor circuit 80 has a fixed amplifier, a variable amplifier, a variable ATT, or the like. These circuits are static circuits. With the signal processor circuit 80, because the NMR signal can be amplified upstream of the frequency converter circuit; that is, at the first stage of the reception signal processor, advantages can be obtained in that the unnecessary signal generated in the reception process or the mixed noise can be reduced. However, so long as the necessary purity or the like for the reception signal can be maintained, the circuits may be changed to dynamic circuits.

The frequency converter circuit specifically includes an input side SW 82, an output side SW 84, and a frequency conversion route 88 and a bypass route 86 provided between the SWs, or the like. On the frequency conversion route 88, a mixer 90 and a BPF 92 are provided. These circuits are static circuits. In the mixer 90, the local signal 68B from the oscillator is mixed with the analog RF reception signal which is input, and, consequently, an intermediate frequency signal is generated. In reality, unnecessary frequency components generated in the mixing process are removed by the BPF 92, and an intermediate frequency signal 93 is thus generated. The BPF 92 has a function, in addition to removing the unnecessary signal components generated by the mixing process (for example, mixer image corresponding to a sum frequency or a difference frequency), as an anti-aliasing filter that suppresses the unnecessary signal in relation to under-sampling to be described later. In the present embodiment, a target signal (for example, 125 MHz) serving as the intermediate frequency signal appears in a third Nyquist zone (for example, 100-150 MHz with respect to 100 MHz sampling). On the frequency axis, the signal components (noise) existing in ranges other than the third Nyquist zone are removed by the BPF 92. After the under-sampling, a second-order aliased or folded signal component (a mirror component of the target signal and a non-inverted component) which appears in a first Nyquist zone (0-50 MHz) is observed.

As described above, in the present embodiment, when the frequency of the observation nucleus falls within the low frequency band, the direct generation scheme; that is, the non-conversion scheme, is selected, and in this case, the input side SW 82 and the output side SW 84 select the bypass route 86. In other words, in this case, the mixer 90 and the BPF 92 do not function. In this case, the output signal of the frequency converter circuit is not the intermediate frequency signal, and is in fact the RF reception signal.

On the other hand, when the frequency of the observation nucleus falls within the high frequency band, the frequency conversion scheme is selected, and in this case, the input side SW 82 and the output side SW 84 select the frequency conversion route 88. In this case, the mixer 90 and the BPF 92 function. In the mixer 90, the RF reception signal is mixed with the local signal 68B, and the mixed signal passes through the BPF 92 and becomes the intermediate frequency signal 93. The transmission side frequency converter circuit and the reception side frequency converter circuit operate in a cooperating manner. In other words, the frequency converter circuits select the same scheme. Alternatively, a configuration may be considered in which separate schemes are selected in the frequency converter circuits. Alternatively, the frequency converter circuit may be provided only on one of the transmission side and the reception side. In the present embodiment, the scheme is selected according to the frequency of the observation nucleus, but alternatively, the scheme may be selected by the user or selected automatically according to other conditions.

With the selection of the bypass route; that is, in the non-conversion scheme, an advantage can be obtained in that the purity of the transmission signal and the reception signal (in particular, the reception signal) can be maintained. Specifically, when a signal passes through a circuit, the signal is inevitably affected by the characteristic or the like of the circuit. With such a structure, a problem may be caused in which the signal component is changed or other components are mixed. The mixer or the like may cause such a problem. In particular, maintaining the purity is important for the reception signal, and, especially, at a low frequency in which the sensitivity and precision of the NMR signal becomes problematic, maintenance of the purity is important. According to the present embodiment, when the RF frequency is low, the non-conversion scheme is selected, and the mixer or the like is bypassed at the transmission side and the reception side. Thus, an advantage can be obtained in that it becomes possible to avoid a problem that unnecessary signals or noise are mixed to the transmission signal and the reception signal due to the mixing or the signal process or the like of the high-frequency signal.

The signal processor circuit 94 includes circuits such as a fixed amplifier, a variable ATT, an LPF, a variable amplifier, or the like. These circuits are static circuits. So long as the quality of the reception signal can be maintained, dynamic circuits may alternatively be employed.

An ADC (A/D converter) 96 is a circuit which converts an analog reception signal 95 which is input (RF reception signal or intermediate frequency signal) into a digital reception signal 97. A sampling frequency of the ADC 96 is, for example, 100 MHz in the present embodiment. In the present embodiment, when the frequency of the observation nucleus falls within a low frequency band of greater than or equal to 5 MHz and less than 50 MHz, the sampling scheme of the ADC 96 becomes over-sampling. In other words, according to Nyquist's theorem, the sampling becomes a sampling with respect to a signal having a frequency of less than ½ of 100 MHz (50 MHz).

On the other hand, when the frequency of the observation nucleus falls within a high frequency band of greater than or equal to 50 MHz and less than or equal to 1000 MHz, the sampling scheme of the ADC 96 becomes under-sampling. That is, with the action of the mixer 90, the frequency of the RF reception signal is fixedly converted to the intermediate frequency of 125 MHz. The intermediate frequency signal is sampled at 100 MHz. Assuming this process, an aliased signal component which is folded from the third Nyquist zone through the second Nyquist zone to the first Nyquist zone (second-order folded signal component) is set as the observation target. In this case also, because the unnecessary noise is reduced in advance with the action of the BPF 92 described above, reduction in S/N ratio is prevented. In the first Nyquist zone, a spectrum appears similar to that of the third Nyquist zone. Therefore, by observing the signal existing in the third Nyquist zone via the first Nyquist zone, a spectrum inversion process or the like becomes unnecessary, and an advantage can be obtained that the signal analysis can be easily executed.

In the present embodiment, the intermediate frequency is 125 MHz, and, in principle, for the sampling, a sampling frequency of greater than or equal to 250 MHz, desirably, greater than or equal to 300 MHz, for example, is necessary (in this case, the sampling becomes over-sampling). An ADC which can execute such a high-speed sampling, and in particular, which has a high data resolution (for example, greater than or equal to 16 bits and greater than or equal to 200 Msps) is relatively expensive, and in many cases, it is difficult to obtain or use such an ADC. According to the present embodiment, the under-sampling scheme may be applied for the intermediate frequency signal, and, in addition, the BPF is effectively utilized. Thus, a superior measurement precision can be achieved while using an ADC which is relatively inexpensive and which has a superior resolution.

The quadrature detection circuit is provided downstream of the ADC 96, and includes two mixers 98 and 100 provided in parallel to each other. The mixers 98 and 100 multiply a pair of reference signals 99 generated by a reference signal generator circuit 102; more specifically, a cos signal 99A and a sin signal 99B, by the digital reception signal 97. With this process, the reception signal is converted into a complex signal 101 of an audio frequency band. The complex signal 101 is made of a real part signal 101A and an imaginary part signal 101B.

The reference signal generator circuit 102 in the present embodiment has two reception NCOs that generate a pair of reference signals. The reception NCOs have the same structure as each other. Further, as the reception NCO, apparatuses similar to the transmission NCO for generating the transmission signal are used. Thus, the reception NCO has an arbitrary frequency generation function, a frequency modulation function, and a phase modulation function. When the reception signal to be processed is an intermediate frequency signal, a pair of reference signals having a certain frequency (for example, 25 MHz) for converting the intermediate frequency signal into a baseband signal are generated. When the reception signal is an RF reception signal, a pair of reference signals having a frequency (for example, less than 50 MHz as described above) for converting the RF reception signal into a baseband signal are generated.

In the present embodiment, operations of the two reception NCOs are controlled by a reception sequencer. Therefore, it is possible to dynamically change the parameter supplied to each of the reception NCOs during the measurement, to dynamically switch the phase modulation condition and the frequency modulation condition. Alternatively, the frequency of the reference signal may be dynamically changed. As described, in the present embodiment, a highly-functional quadrature detection circuit is realized. With such a configuration, a high-degree measurement satisfying various needs, and a signal process having a high degree of freedom can be realized.

Two digital filter circuits 104 and 106 are provided downstream of the quadrature detection circuit. These circuits are static circuits, and have a function to remove unnecessary signal components generated by the mixing process and a function to reduce a number of data points before the FFT calculation to convert the sampling rate (decimation). Each of the digital filter circuits 104 and 106 is formed by, for example, a CIC decimation circuit. Reception signals 108 after a predetermined process is applied; that is, a real part signal 108A and an imaginary part signal 108B, are stored in the reception data memory as reception data. Later, processes such as the frequency analysis are executed for reception data which are read from the reception data memory.

The sequencers 26 and 28, the transmission signal generator 30, and the reception signal processor 34 shown in FIG. 1 can be realized by a device such as an FPGA.

(4) Adaptive Selection of Operation Condition According to Frequency of Observation Nucleus FIG. 4 summarizes two operation conditions selected according to the frequency of the observation nucleus. Reference numeral 110 shows a frequency (RF) of the observation nucleus, reference numeral 112 shows a transmission signal (original signal) and a reception signal as a target of sampling, reference numeral 114 shows the content of a route selection at the transmission side, reference numeral 116 shows the content of a route selection at the reception side, and reference numeral 118 shows a sampling scheme. Reference numeral 120 shows a case where the frequency of the observation nucleus is greater than or equal to 5 MHz and less than 50 MHz; that is, a case where the frequency falls within the low frequency band, and reference numeral 122 shows a case where the frequency of the observation nucleus is greater than or equal to 50 MHz and less than or equal to 1000 MHz; that is, a case where the frequency falls within the high frequency band.

As shown in FIG. 4, when the frequency of the observation nucleus falls within the low frequency band (refer to reference numeral 120), the direct generation scheme (non-conversion scheme) is applied. More specifically, the generated transmission signal is an RF transmission signal rather than an intermediate frequency signal, the bypass route is selected at the transmission side, and the bypass route is selected also at the reception side. Further, the sampling scheme is over-sampling. In this case, the signal to be sampled is the RF reception signal.

On the other hand, when the frequency of the observation nucleus falls within the high frequency band (refer to reference numeral 122), the frequency conversion scheme is applied. More specifically, the generated transmission signal is an intermediate frequency signal rather than an RF transmission signal, the frequency conversion route is selected at the transmission side, and the frequency conversion route is selected also at the reception side. Further, the sampling scheme is under-sampling. The signal to be sampled is the intermediate frequency signal (IF signal).

Alternatively, the lower limit of the low frequency band may be set to a frequency lower than 5 MHz (for example, 1 MHz) or a frequency greater than 5 MHz (for example, 10 MHz). Similarly, the upper limit of the high frequency band may be set to a frequency higher than 1000 MHz (for example, 1500 MHz) or a frequency lower than 1000 MHz (for example, 500 MHz). In the above-described example configuration, a boundary frequency for dividing the two frequency bands is 50 MHz, but the boundary frequency may alternatively be set to a lower frequency. A suitable boundary frequency is desirably determined based on the sampling frequency. Alternatively, a configuration may be employed in which parts of the two frequency bands overlap, and the operation condition can be selected for the overlapped parts. Alternatively, a frequency band which cannot be selected may exist between the two frequency bands.

Figure 5:
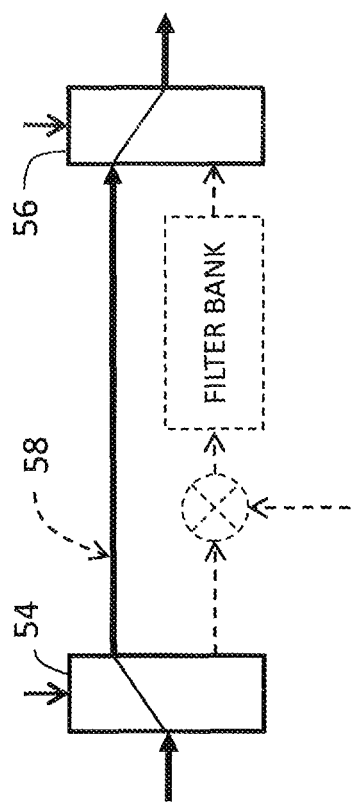
FIG. 5 shows a first example operation of a transmission side frequency converter circuit.

(5) Detailed Description of Selection of Frequency Conversion Scheme and Non-Conversion Scheme FIG. 5 shows a first example operation of a transmission side frequency converter circuit (example operation when the non-conversion scheme is selected). In FIG. 5, when the frequency of the observation nucleus falls within the low frequency band, the bypass route 58 is selected by an action of two SWs 54 and 56, and the RF transmission signal passes through the bypass route 58. In this example configuration, no circuit is provided on the bypass route 58. In this state, the operation of the oscillator may be stopped, but in order to secure stability of the operation thereof, it is desirable to continue the operation of the oscillator. In either case, when the non-conversion scheme is selected, the mixer and the filter bank substantially do not function.

Figure 6:
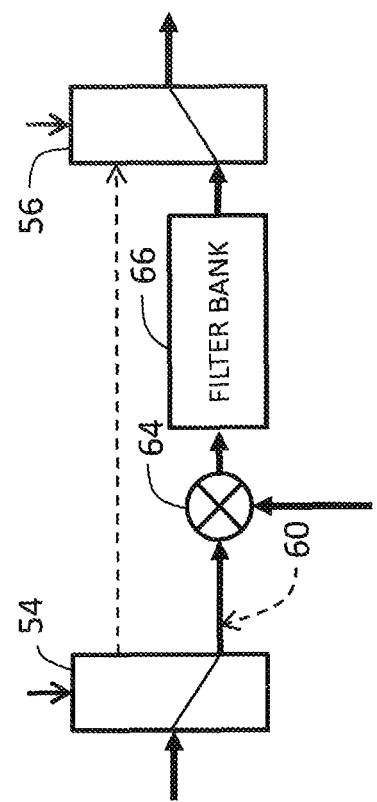
FIG. 6 shows a second example operation of the transmission side frequency converter circuit.

FIG. 6 shows a second example operation of the transmission side frequency converter circuit (example operation when the frequency conversion scheme is selected). In FIG. 6, when the frequency of the observation nucleus falls within the high frequency band, the frequency conversion route 60 is selected by the action of the two SWs 54 and 56, and the intermediate frequency signal (IF transmission signal) passes through the frequency conversion route 60. On the frequency conversion route 60, the mixer 64 and the filter bank 66 are provided. With these circuits, the IF transmission signal is converted into the RF transmission signal. In this case, by changing the frequency of the local signal which is input to the mixer 64, it is possible to generate an RF transmission signal having a desired frequency.

Figure 7:
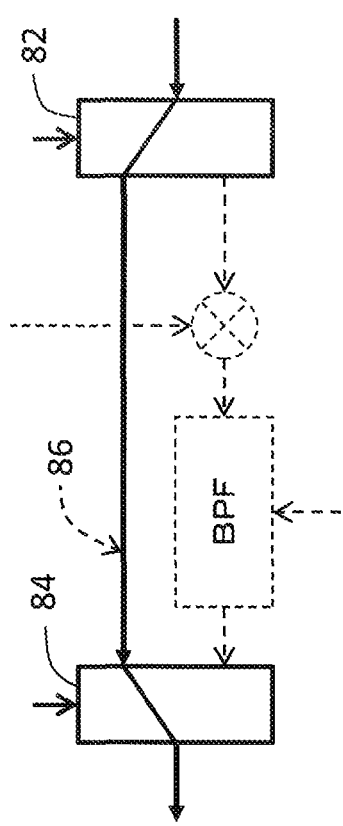
FIG. 7 shows a first example operation of a reception side frequency converter circuit.

FIG. 7 shows a first example operation of the reception side frequency converter circuit (example operation when the non-conversion scheme is selected). In FIG. 7, when the frequency of the observation nucleus falls within the low frequency band, the bypass route 86 is selected by the action of the two SWs 82 and 84, and the RF reception signal passes through the bypass route 86. In this example configuration, no circuit is provided on the bypass route 86.

Figure 8:
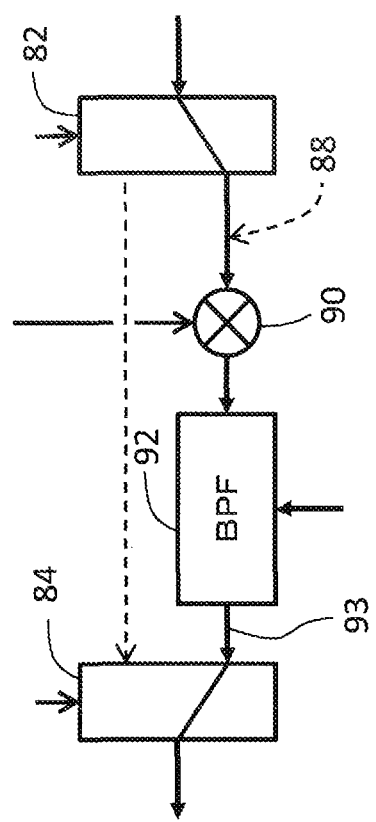
FIG. 8 shows a second example operation of the reception side frequency converter circuit.

FIG. 8 shows a second example operation of the reception side frequency converter circuit (example operation when the frequency conversion scheme is selected). In FIG. 8, when the frequency of the observation nucleus falls within the high frequency band, the frequency conversion route 88 is selected by the action of the two SWs 82 and 84, and the intermediate frequency signal (IF reception signal) passes through the frequency conversion route 88. On the frequency conversion route 88, the mixer 90 and the BPF 92 are provided. With these circuits, the RF reception signal is converted into the IF reception signal. In this case, the same signal as the local signal used in the transmission side frequency conversion is input to the mixer 90.

Alternatively, in the transmission side frequency conversion and the reception side frequency conversion, a configuration may be employed in which, when the frequency of the observation nucleus falls within a first frequency range on a low band side (LF range), a difference frequency component after the mixing process is extracted, and, when the frequency of the observation nucleus falls within a second frequency range at a higher band side than the first frequency range (HF range), a sum frequency component after the mixing process is extracted. According to such a configuration, when the frequency of the observation nucleus falls within the LF range, the frequency of the local signal generated at the oscillator would be higher compared to the frequency of the observation nucleus by the intermediate frequency, and, when the frequency of the observation nucleus falls within the HF range, the frequency of the local signal generated at the oscillator would be lower compared to the frequency of the observation nucleus by the intermediate frequency. In other words, a width of the frequency to be generated at the oscillator can be narrowed. With such a configuration, an advantage on the circuit structure can be obtained. In general, as a frequency of a signal to be generated (in this case, the local signal) is increased, it becomes more difficult to generate a high signal purity. With the above-described configuration, such a problem can be reduced or avoided. When the above-described configuration is to be employed, it is necessary to switch the characteristic of the filter circuit at the downstream of the mixer between the cases of the difference frequency component extraction and the sum frequency component extraction.

Figure 9:
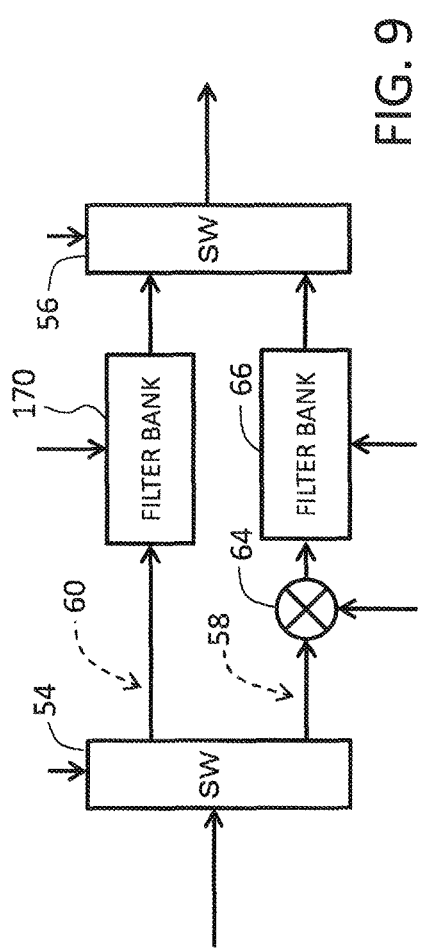
FIG. 9 shows a second example configuration of a transmission side frequency converter circuit.

FIG. 9 shows a second example configuration of the transmission side frequency converter circuit. In FIG. 9, structures similar to the structures shown in FIG. 3 are assigned the same reference numerals as in FIG. 3. This is also true for other drawings. In the exemplified structure, a filter bank 170 is provided on the bypass route 60. That is, a necessary process such as the filter process may be applied to the RF transmission signal when the RF transmission signal passes through the bypass route 60. The filter bank 170 has a frequency characteristic that is variable according to the frequency of the RF transmission signal. Alternatively, other filter circuits such as a variable BPF or another processing circuit may be provided in place of the filter bank.

Figure 10:
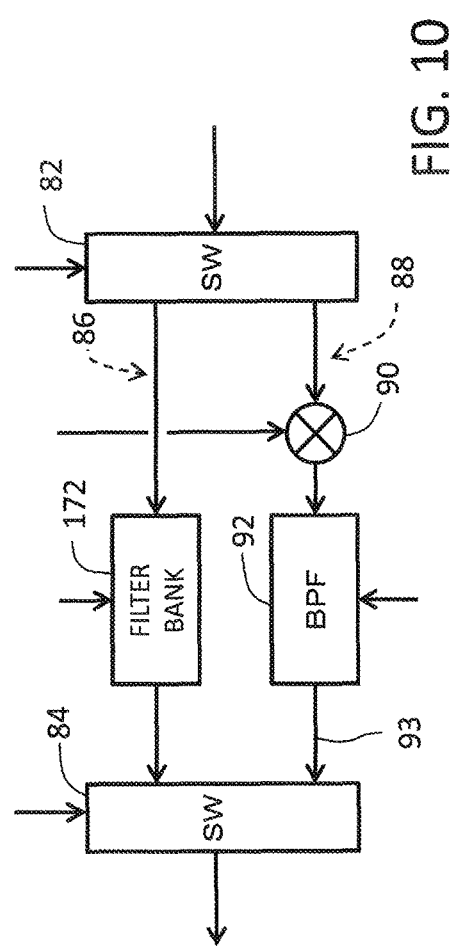
FIG. 10 shows a second example configuration of a reception side frequency converter circuit.

FIG. 10 shows a second example configuration of the reception side frequency converter circuit. A filter bank 172 is provided on the bypass route 86. A filter process or the like is applied on the RF reception signal as necessary, when the RF reception signal passes through the bypass route 86. The filter bank 172 has a frequency characteristic variable according to the frequency of the RF reception signal.

Figure 11:
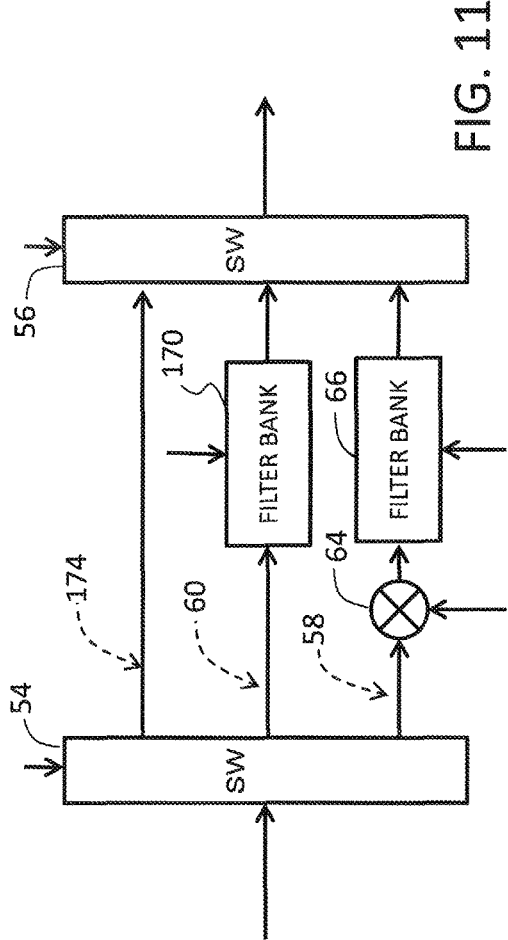
FIG. 11 shows a third example configuration of a transmission side frequency converter circuit.

FIG. 11 shows a third example configuration of the transmission side frequency converter circuit. In this example configuration, the frequency conversion route 58, a first bypass route 60, and a second bypass route 174 are provided in parallel to each other between the two SWs 54 and 56. When the first bypass route 60 is selected, the RF transmission signal passes through the filter bank 170. When the filter process is to be applied on the RF transmission signal, the first bypass route 60 is selected. When the second bypass route 174 is selected, the RF transmission signal is output without any processing. In this case, the purity of the signal can be maintained, and there is an advantage that the influences by the filter can be avoided when a frequency modulation is applied over a wide range. Because the number of circuits on the route is smaller in the case where the first bypass route 60 is selected compared to the case where the frequency conversion route 58 is selected, in general, the reduction of the signal purity is lower.

Figure 12:
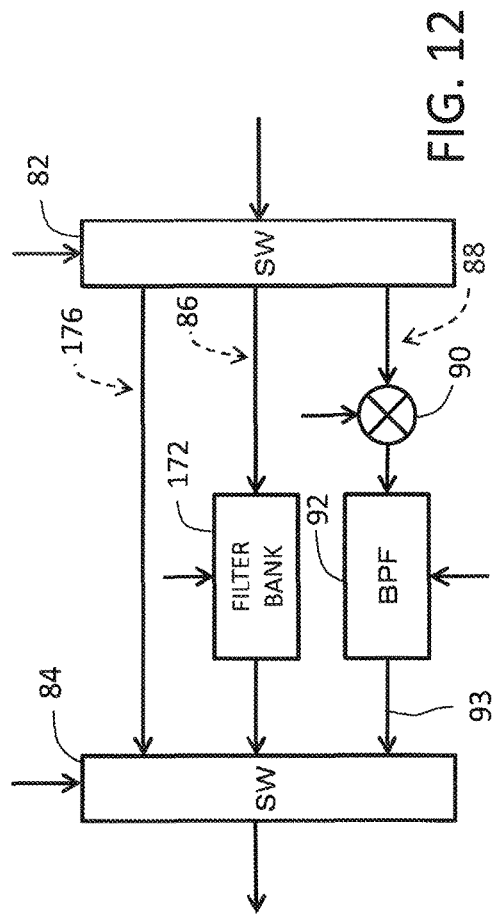
FIG. 12 shows a third example configuration of a reception side frequency converter circuit.

FIG. 12 shows a third example configuration of the reception side frequency converter circuit. In this example configuration, the frequency conversion route 88, a first bypass route 86, and a second bypass route 176 are provided in parallel to each other between two SWs 82 and 84. When the first bypass route 86 is selected, the RF reception signal passes through the filter bank 172. When the filter process is to be applied to the RF reception signal, the first bypass route 86 is selected. When the second bypass route 176 is selected, the RF reception signal is output without any processing. In this case, the purity of the signal can be maintained. Because the number of circuits on the route is smaller in the case where the first bypass route 86 is selected compared to the case where the frequency conversion rout 88 is selected, in general, the reduction in the signal purity is lower. The maintenance of the signal purity is particularly important in the reception signal process.

Figure 13:
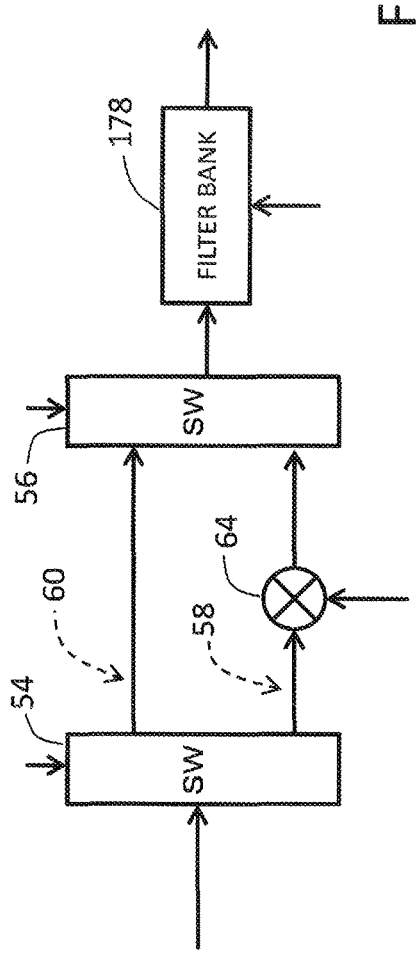
FIG. 13 shows a fourth example configuration of a transmission side frequency converter circuit.

FIG. 13 shows a fourth example configuration of the transmission side frequency converter circuit. In this example configuration, only the mixer 64 is provided on the frequency conversion route 58. A filter bank 178 is provided downstream of the SW 56. Extraction of the sum frequency component or the difference frequency component generated after the mixing process is executed by the filter bank 178. Although no circuit is provided on the bypass route 60, a filter process may be applied as necessary by the filter bank 178 provided downstream of the SW 84 on the RF transmission signal passing through the bypass route 60. The filter bank 178 is formed by a plurality filters that limits the band according to the frequency of the RF transmission signal, and a suitable filter is selected from the plurality of filters.

Figure 14:
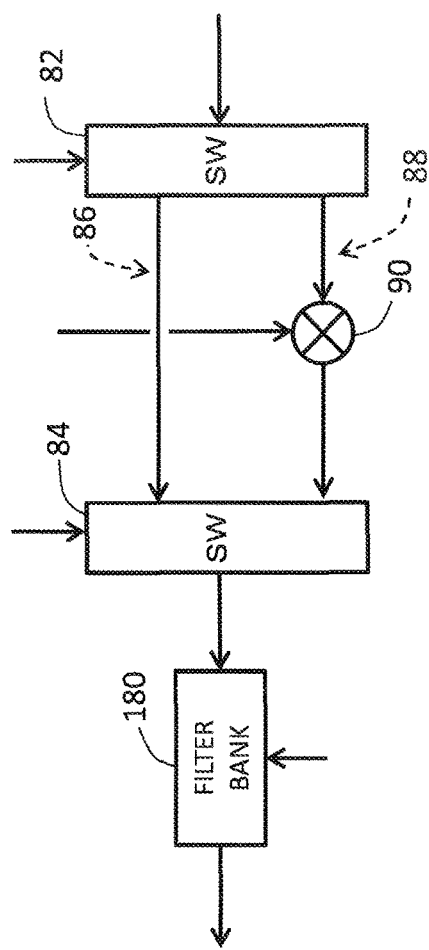
FIG. 14 shows a fourth example configuration of a reception side frequency converter circuit.

FIG. 14 shows a fourth example configuration of the reception side frequency converter circuit. In this example configuration, only the mixer 90 is provided on the frequency conversion route 88. A filter bank 180 is provided downstream of the SW 84. Extraction of the sum frequency component or the difference frequency component generated after the mixing process is executed by the filter bank 180. Although no circuit is provided on the bypass route 86, a filter process may be applied as necessary by the filter bank 180 provided downstream of the SW 56 on the RF reception signal passing through the bypass route 86. The filter bank 180 is formed by, for example, a filter for extracting the intermediate frequency signal, and one or more filters for applying a band process on the RF reception signal.

FIG. 15 shows a fifth example configuration of the transmission side and reception side frequency converter circuits. As shown in FIG. 15, no bypass route is provided on the transmission side or the reception side, but a configuration is employed in which, when the non-conversion scheme is selected, the mixers 64 and 90 substantially do not operate. Specifically, the local signal from the oscillator 62 is input to one input terminal of a SW 184, and a DC signal is input to the other input terminal of the SW 184. When the frequency conversion scheme is selected, the local signal is output to the transmission side mixer 64 and the reception side mixer 90. With this configuration, mixing of the local signal to the intermediate frequency signal is executed at the transmission side mixer 64, and the signal generated by the mixing process is transmitted to the filter bank 182. In the reception side mixer 90, mixing of the local signal with the RF reception signal is executed, and the signal generated by the mixing process is transmitted to the filter bank 186.

On the other hand, when the non-conversion scheme is selected, the DC signal (for example, a 0 Hz signal with an amplitude of 1.0) is output to the transmission side mixer 64 and the reception side mixer 90. The transmission side mixer 64 mixes the DC signal with the RF transmission signal (or, with the DC signal input, the mixer 64 is set to an operation state to let the RF transmission signal pass through). The RF transmission signal which is output from the mixer 64 is filter-processed by the filter bank 182 as necessary, and the processed signal is transmitted to the power amplifier. The reception side mixer 90 mixes the DC signal with the RF reception signal (or, with the DC signal input, the mixer 90 is set to an operation state to let the RF reception signal pass through). The RF reception signal which is output from the mixer 90 is filter-processed by the filter bank 186 as necessary, and the processed signal is transmitted to downstream circuits. According to this configuration, the frequency conversion operation and the non-conversion operation can be switched without the route selection (routing). Alternatively, in the above-described structure, a configuration may be employed in which an operation similar to the above is executed by stopping the operation of the oscillator 62.

In the present embodiment, the frequency conversion scheme or the non-conversion scheme is selected according to the frequency of the observation nucleus. Alternatively, a configuration may be employed in which the scheme is selected based on other conditions. For example, a first mode which prioritizes the signal purity and a second mode which prioritizes avoidance or reduction of the influence of the frequency dependency may be prepared, the non-conversion scheme may be selected when the first mode is manually or automatically selected, and the frequency conversion scheme may be selected when the second mode is manually or automatically selected.

The invention claimed is:

1. A magnetic resonance measurement apparatus comprising:
    a transmission signal generator that generates a radio frequency (RF) transmission signal; and
    a reception signal processor that processes an RF reception signal; and
    a controller that controls the transmission signal generator and the reception signal processor, the controller selecting a frequency conversion scheme when an observation frequency serving as a magnetic resonance frequency of an observation nucleus falls within a first frequency band, and selecting a non-conversion scheme when the observation frequency falls within a second frequency band which is lower than the first frequency band, wherein the observation nucleus is a nucleus of a sample substance under observation during a measurement of magnetic resonance of the nucleus of the sample substance, wherein the transmission signal generator comprises:
an original signal generator circuit that:
generates a frequency conversion scheme signal when the frequency conversion scheme is selected, wherein a frequency of the frequency conversion scheme signal is a fixed frequency; and
generates a non-frequency conversion scheme signal when the non-conversion scheme is selected, wherein a frequency of the non-frequency conversion scheme signal is based on the observation nucleus, and
a transmission side frequency converter circuit that converts the frequency conversion scheme signal into the RF transmission signal when the frequency conversion scheme is selected.

2. The magnetic resonance measurement apparatus according to claim 1,
wherein the transmission side frequency converter circuit comprises:
a frequency conversion route having a frequency conversion mixer;
a bypass route provided in parallel with the frequency conversion route; and
a selection circuit that selects the frequency conversion route or the bypass route.

3. The magnetic resonance measurement apparatus according to claim 1,
wherein the reception signal processor comprises:
a reception side frequency converter circuit that converts the RF reception signal into a converted RF reception signal when the frequency conversion scheme is selected; and
a sampling circuit that samples the converted RF reception signal when the frequency conversion scheme is selected and samples the RF reception signal when the non-conversion scheme is selected.

4. The magnetic resonance measurement apparatus according to claim 3,
wherein the reception side frequency converter circuit comprises:
a frequency conversion route having a frequency conversion mixer;
a bypass route provided in parallel with the frequency conversion route; and
a selection circuit that selects the frequency conversion route or the bypass route.

5. The magnetic resonance measurement apparatus according to claim 3, wherein the reception side frequency converter circuit comprises a band pass filter that processes the converted RF reception signal and outputs a processed RF reception signal to the sampling circuit, and
a sampling scheme applied by the sampling circuit is under-sampling when the frequency conversion scheme is selected, and the sampling scheme applied by the sampling circuit is over-sampling when the non-conversion scheme is selected, and
the band pass filter has:
a first function to remove unnecessary frequency components generated in the frequency conversion scheme; and
a second function to remove, before the under-sampling, an unnecessary signal that exists in a range other than a predetermined Nyquist zone.

6. The magnetic resonance measurement apparatus according to claim 3, wherein the controller selects:
the frequency conversion scheme when the observation frequency falls within the first frequency band, which is based on ½ of a sampling frequency of the sampling circuit; or
the non-conversion scheme when the observation frequency falls within the second frequency band, which is based on ½ of the sampling frequency of the sampling circuit.

7. The magnetic resonance measurement apparatus according to claim 3, wherein the reception side frequency converter circuit extracts one of the sum frequency component or the difference frequency component generated by mixing the local signal for a reception side frequency conversion with the RF reception signal according to the observation frequency, and outputs the extracted component as the converted RF reception signal.

8. The magnetic resonance measurement apparatus according to claim 1, wherein at least one of the transmission signal generator and the reception signal processor comprises a mixer that executes a frequency conversion operation in the frequency conversion scheme and executes a non-conversion operation in the non-conversion scheme, and
a signal passes through the mixer in either scheme of the frequency conversion scheme and the non-conversion scheme.

9. The magnetic resonance measurement apparatus according to claim 1, wherein the transmission side frequency converter circuit extracts one of a sum frequency component or a difference frequency component generated by mixing a local signal for a transmission side frequency conversion with the frequency conversion scheme signal according to the observation frequency, and outputs the extracted component as the RF transmission signal.

* * * * *